(12) United States Patent
Jo (10) Patent No.: US 8,839,071 B2
(45) Date of Patent: Sep. 16, 2014

(54) SEMICONDUCTOR MEMORY DEVICES THAT ARE CONFIGURED TO ANALYZE READ FAILURES AND RELATED METHODS OF OPERATING SUCH DEVICES

(75) Inventor: Sung-Kyu Jo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 772 days.

(21) Appl. No.: 12/275,470

(22) Filed: Nov. 21, 2008

(65) Prior Publication Data

US 2009/0164871 A1 Jun. 25, 2009

(30) Foreign Application Priority Data

Dec. 20, 2007 (KR) .................. 10-2007-0134413

(51) Int. Cl.
*G11C 29/00* (2006.01)
(52) U.S. Cl.
USPC .......................................... 714/763; 714/773
(58) Field of Classification Search
USPC .................................................. 714/763, 773
See application file for complete search history.

(56) References Cited

U.S. PATENT DOCUMENTS

| | | | |
|---|---|---|---|
| 4,549,295 A | 10/1985 | Purvis | |
| 5,237,535 A * | 8/1993 | Mielke et al. | 365/185.3 |
| 5,475,693 A | 12/1995 | Christopherson et al. | |
| 6,031,762 A | 2/2000 | Saitoh | |
| 6,799,291 B1 * | 9/2004 | Kilmer et al. | 714/722 |
| 7,596,738 B2 * | 9/2009 | Chessin et al. | 714/763 |
| 2002/0004921 A1 | 1/2002 | Muranaka et al. | |
| 2004/0257888 A1 | 12/2004 | Noguchi et al. | |
| 2005/0024939 A1 | 2/2005 | Chen et al. | |
| 2005/0052770 A1 * | 3/2005 | Osafune | 360/51 |
| 2005/0083726 A1 * | 4/2005 | Auclair et al. | 365/154 |
| 2005/0207222 A1 | 9/2005 | Chen et al. | |
| 2005/0219904 A1 * | 10/2005 | Sakurai et al. | 365/185.18 |
| 2006/0155919 A1 * | 7/2006 | Lasser et al. | 711/103 |
| 2006/0227634 A1 | 10/2006 | Loh et al. | |
| 2006/0268608 A1 | 11/2006 | Noguchi et al. | |
| 2007/0127289 A1 | 6/2007 | Lee | |
| 2007/0234183 A1 * | 10/2007 | Hwang et al. | 714/763 |
| 2008/0043527 A1 * | 2/2008 | Aritome | 365/185.03 |
| 2008/0055989 A1 | 3/2008 | Lee et al. | |
| 2008/0077841 A1 | 3/2008 | Gonzalez et al. | |
| 2008/0077842 A1 | 3/2008 | Gonzalez et al. | |
| 2008/0205136 A1 | 8/2008 | Wang et al. | |
| 2009/0109743 A1 * | 4/2009 | Goda et al. | 365/185.03 |
| 2009/0201727 A1 | 8/2009 | Wang et al. | |
| 2011/0026326 A1 | 2/2011 | Lee et al. | |
| 2011/0099438 A1 | 4/2011 | Gonzalez et al. | |

FOREIGN PATENT DOCUMENTS

| | | |
|---|---|---|
| CN | 1175311 A | 3/1998 |
| CN | 1230752 A | 10/1999 |
| CN | 1983445 A | 6/2007 |

(Continued)

*Primary Examiner* — M. Mujtaba K Chaudry
(74) *Attorney, Agent, or Firm* — Myers Bigel Sibley & Sajovec, P.A.

(57) ABSTRACT

Semiconductor memory devices are provided that include a nonvolatile memory that has a plurality of memory cells and a memory controller that is configured to control at least some of the operations of the nonvolatile memory. The memory controller include an error correction unit. Moreover, the memory controller is configured to determine whether a read failure that occurs during a read operation of a first of the plurality of memory cells is due to charge leakage based at least in part on an output of the error correction unit. Related methods are also disclosed.

10 Claims, 10 Drawing Sheets

(56) References Cited

FOREIGN PATENT DOCUMENTS

| | | |
|---|---|---|
| CN | 101183563 A | 5/2008 |
| CN | 101252020 A | 8/2008 |
| JP | 09-204367 | 8/1997 |
| JP | 2004326867 A | 11/2004 |
| JP | 2007500411 A | 1/2007 |
| WO | WO 2005/015566 A1 | 2/2005 |
| WO | WO 2008/039692 A2 | 4/2008 |

* cited by examiner

SEMICONDUCTOR MEMORY DEVICES THAT ARE CONFIGURED TO ANALYZE READ FAILURES AND RELATED METHODS OF OPERATING SUCH DEVICES

CROSS-REFERENCE TO RELATED APPLICATION

This U.S. non-provisional patent application claims priority under 35 U.S.C. §119 from Korean Patent Application No. 10-2007-0134413, filed on Dec. 20, 2007, the entire content of which is incorporated herein by reference as if set forth in its entirety.

BACKGROUND

The present invention relates to semiconductor devices and, in particular, to semiconductor memory devices that may experience read failures and to related methods of analyzing such read failures.

Semiconductor memory devices are generally classified into volatile memory devices, such as dynamic random access memories (DRAMs) and static random access memories (SRAMs), and nonvolatile memory devices such as electrically erasable and programmable read-only memories (EEPROMs), ferroelectric RAMs, phase-changeable RAMs, magnetic RAMs (MRAMs), and flash memories. Volatile memories lose the data stored therein if the power supply to the memory is interrupted. In contrast, nonvolatile memories retain the data stored therein even when power to the memory is shut off. Flash memories are used as storage media in a wide variety of applications due to, for example, their relatively fast programming speeds, low power consumption and large data capacity.

A flash memory includes a memory cell array for storing data. The memory cell array will typically include a plurality of memory blocks. Each memory block, in turn, includes a plurality of pages, and each page is formed from a plurality of memory cells. Typically, a flash memory will perform an erase operation on an entire memory block, while read and write operations are performed on one page at a time.

In a flash memory that uses two-level memory cells, each memory cell may be classified as an "on-cell" or as an "off-cell" based on the threshold voltage distribution of the cell. An on-cell stores data "1," which is referred to as an "erased cell." An off-cell stores data "0," which is referred to as a "programmed cell." Each on-cell may be conditioned, for example, to have a threshold voltage between −3 V and −1 V, while each off-cell may be conditioned, for example, to have a threshold voltage between +1 V and +3 V.

A flash memory includes a plurality of cell strings. A cell string is formed of a string selection transistor that is coupled to a string selection line, a plurality of memory cells that are each coupled to respective ones of a plurality of word lines, and a ground selection transistor that is coupled to a ground selection line. A source/drain region of the string selection transistor is connected to a bit line and a source/drain region of the ground selection transistor is connected to a common source line.

During a read operation, a selective read voltage (Vrd) of about 0 V is applied to a selected word line while a de-selective read voltage (Vread) of about 4.5 V is applied to each de-selected word line. The de-selective read voltage has a level that is sufficient to turn on the memory cells that are coupled to the de-selected word lines.

A read failure may occur for a variety of reasons during a read operation. Herein, a "read failure" refers to a read operation in which (1) a memory cell that has been programmed as an on-cell (data value of "1") is sensed as an off-cell (data value of "0") or (2) a memory cell that has been programmed as an off-cell (data value "0") is sensed as an on-cell (data value "1").

A read failure may occur because of (1) charge leakage, (2) soft-programming and (3) over-programming. A read failure due to charge leakage may occur when charges are released from a programmed cell into a channel. A read failure due to soft-programming may occur when a threshold voltage of an on-cell is increased. A read fail due to over-programming may occur when a threshold voltage of an off-cell is increased.

SUMMARY

Pursuant to embodiments of the present invention, semiconductor memory devices are provided that include a nonvolatile memory that has a plurality of memory cells and a memory controller that is configured to control at least some of the operations of the nonvolatile memory. The memory controller include an error correction unit. Moreover, the memory controller is configured to determine whether a read failure that occurs during a read operation of a first of the plurality of memory cells is due to charge leakage based at least in part on an output of the error correction unit.

In some embodiments, the memory controller may be further configured to increase a selective read voltage and perform a second read operation on the first of the plurality of memory cells if the output of the error correction unit indicates that the first of the plurality of memory cells was programmed with data "1" but was sensed as storing data "0." The memory controller may also be configured to determine if the read failure is due to soft-programming by increasing a selective read voltage and performing a second read operation on the first of the plurality of memory cells. In such embodiments, the memory controller may be configured to identify the read failure as being caused by soft-programming when a second read failure does not occur during the second read operation and to identify the read failure as being caused by over-programming when the second read failure occurs during the second read operation.

The memory controller may also, in some embodiments, be configured to repair the first of the plurality of memory cells by a charge refresh operation when the read failure is identified as being caused by soft-programming or charge leakage, to repair the first of the plurality of memory cells by increasing a de-selective read voltage when the read failure is identified as being caused by over-programming.

Pursuant to further embodiments of the present invention, methods for analyzing a read failure of a semiconductor memory device that includes a nonvolatile memory and a memory controller are provided. Pursuant to these methods, an error correction code associated with a first data read operation from the nonvolatile memory is analyzed to determine whether the read failure is due to charge leakage. In some embodiments, a selective read voltage that was used in the first data read operation may be increased and a second read operation may be performed using the increased selective read voltage to determine whether the read failure resulted because of soft-programming. If a second read failure does not occur during the second read operation, the read failure may be identified as being caused by soft-programming.

Pursuant to further embodiments of the present invention, methods of repairing a memory cell of a nonvolatile memory that experiences a read failure during a first read operation are provided. Pursuant to these methods, an output of an error correction unit is used to classify the cause of the read failure. Then, a method for repairing the memory cell is selected based on the classification of the cause of the read failure.

In some embodiments, the cause of the read failure is classified as being due to charge leakage if the output of the error correction unit indicates that the memory cell was programmed with data "0" but was sensed as storing data "1." Likewise, the cause of the read failure may be is classified as being one of soft-programming or over-programming if the output of the error correction unit indicates that the memory cell was programmed with data "1" but was sensed as storing data "0."

In some embodiments, the method may also involve performing a second read operation on the memory cell after classifying the cause of the read failure being one of soft-programming or over-programming. This second read operation is performed using a second selective read voltage that is different than a first selective read voltage that was used during the first read operation. The cause of the read failure is then classified as being due to soft-programming if the output of the error correction unit indicates that a read failure did not occur on the memory cell during the second read operation and otherwise classified as being due to over-programming. In such embodiments, a charge refresh operation may be selected as the method for repairing the memory cell if the cause of the read failure is classified as being due to soft-programming and increasing a de-selective read voltage may instead be selected if the cause of the read failure is classified as being due to over-programming.

BRIEF DESCRIPTION OF THE FIGURES

Non-limiting and non-exhaustive embodiments of the present invention will be described with reference to the following figures. In the figures.

DETAILED DESCRIPTION

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

When a read failure occurs in a flash memory, the flash memory may cure the read failure by various methods such as, for example, reprogramming the effected cell or changing the read voltage. However, repairing a read failure without knowledge of the reason for the read failure can actually act to exacerbate the problem. For example, a read failure could be made worse by repeating a reprogramming cycle if the read failure was due to over-programming. Likewise, a read failure that was due to charge leakage could be made worse if the repair mechanism is changing the selective read voltage. Pursuant to embodiments of the present invention, methods are provided for selecting a type of repair based on the reason that the read failure occurred, as will be described in detail herein.

Figure 1:
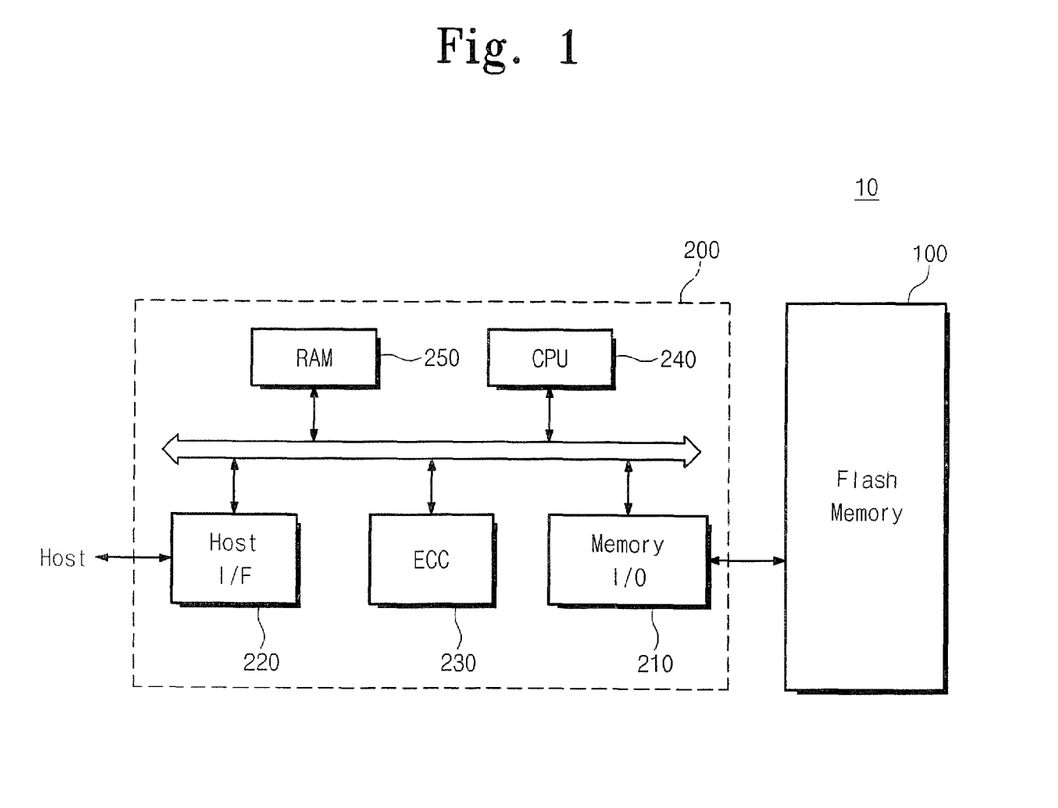
FIG. 1 is a block diagram of a semiconductor memory device according to embodiments of the present invention.

FIG. 1 is a block diagram of a semiconductor memory device 10 according to embodiments of the present invention. As shown in FIG. 1, the semiconductor memory device 10 is comprised of a flash memory 100 that is used to store data and a memory controller 200. The flash memory 100 is a nonvolatile memory that performs read, write and erase operations under the control of the memory controller 200.

The memory controller 200 provides a read command RD_CMD, an address ADDR, and a control signal CTRL in order to perform a read operation. The flash memory 100 receives the read command RD_CMD and the address ADDR, and then provides a read voltage to a corresponding word line of the flash memory 100.

The memory controller 200 is comprised of a memory interface 210, a host interface 220, an error check and correction (ECC) unit 230, a central processing unit (CPU) 240, and a RAM 250. The RAM 250 functions as a working memory for the CPU 240. The host interface 220 is equipped with the protocols that may be used to exchange data with a host.

The ECC unit 230 is configured to analyze and correct bit errors that may occur when reading data from the flash memory 100. The ECC unit 230 may comprise, for example, a hardware circuit, software running on CPU 240 or a combination of software and hardware. The memory interface 210 communicates with the flash memory 100 and is used for exchanging commands, addresses, data, and control signals with the flash memory 100. The CPU 240 controls the general operation of the memory controller 200. Although not shown, it will be understood by those skilled in the art that the semiconductor memory device 10 may also include a ROM (not shown) which stores code data for interfacing with a host.

Figure 2:
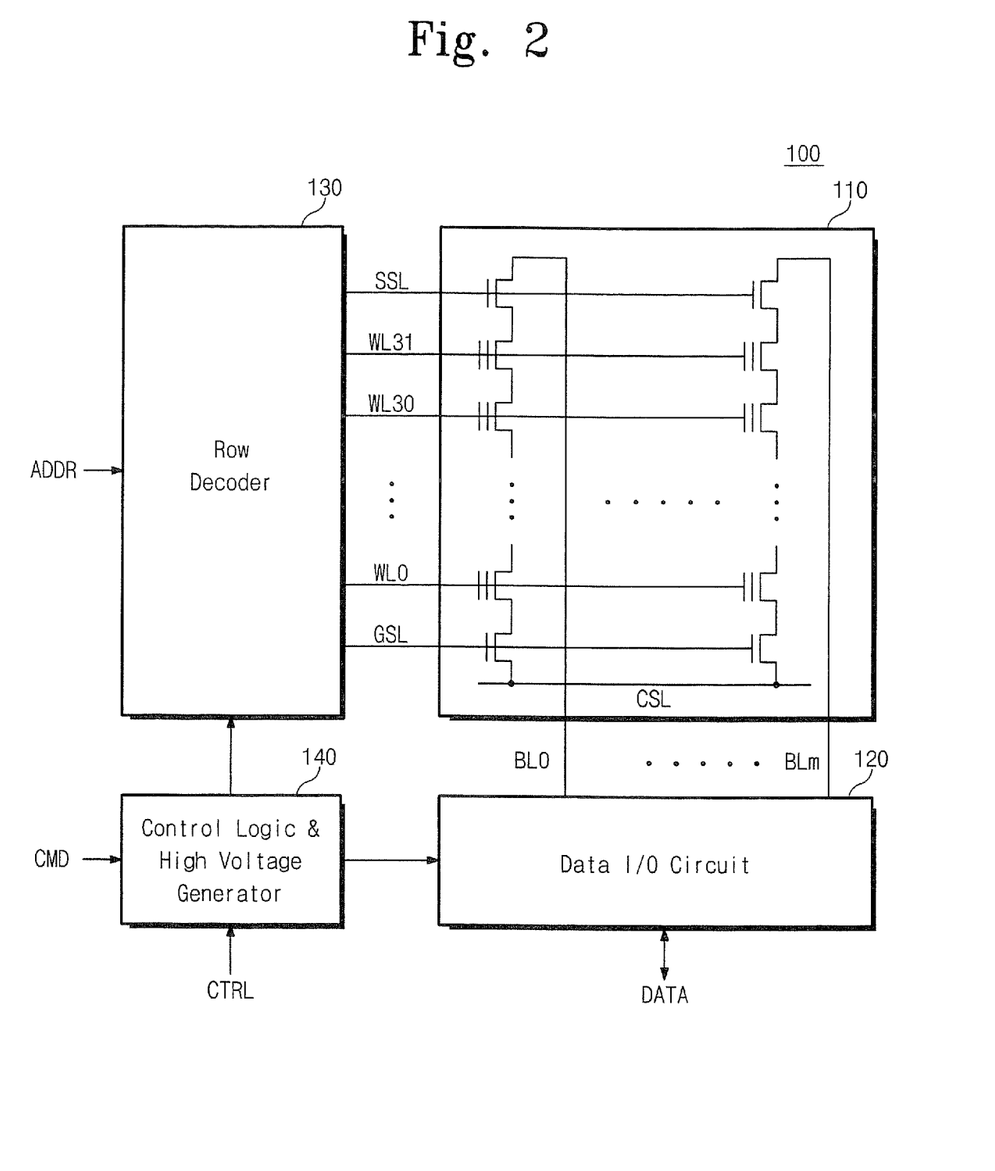
FIG. 2 is a block diagram of the flash memory shown in FIG. 1.

FIG. 2 is a block diagram of an embodiment of the flash memory 100 of FIG. 1. Referring to FIG. 2, the flash memory 100 is comprised of a memory cell array 110, a data input/output circuit 120, a row decoder 130, and a control logic and high voltage generator 140.

The memory cell array 110 includes a plurality of memory blocks. Each memory block includes a plurality of pages. Each page includes a plurality of memory cells. The memory cells may be able to store single-bit data or multi-bit data. The flash memory 100 executes erasing operations in the unit of a memory block, and executes reading and writing operations in the unit of a page.

For purposes of illustration, an exemplary memory block is depicted in the memory cell array 110 of FIG. 2. As shown in FIG. 2, the memory block is comprised of a string selection transistor that is coupled to a string selection line SSL, a plurality of memory cells that are coupled to respective ones of a plurality of word lines WL0~WL31, and a ground selection transistor that is coupled to a ground selection line GSL. A source/drain region of each string selection transistor is connected to a respective one of a plurality of bit lines BL0~BLm, and a source/drain region of each ground selection transistor is connected to a common source line CSL.

During a read operation, a power source voltage Vcc is applied to the string and ground selection lines SSL and GSL. A selective read voltage Vrd is applied to a selected word line (e.g., WL8), while a de-selective read voltage Vread is applied to de-selected word lines WL0~WL7 and WL9~WL31. The de-selective read voltage Vread has a level that is sufficient to turn on the memory cells coupled to the de-selected word lines WL0~WL7 and WL9~WL31.

The bit lines BL0~BLm connect the data input/output circuit 120 to the memory cell array 110. The data input/output circuit 120 receives data DATA through a data input/output line (not shown). Input data is stored in a selected memory cell. The data input/output circuit 120 reads data from the memory cell through the bit lines BL0~BLm. Read data is output from the flash memory 100 by way of the data input/output line.

The word lines WL0~WL31 connect the row decoder 130 to the memory cell array 110. The row decoder 130 receives the address ADDR and selects a memory block or page.

The control logic and high voltage generator 140 controls the data input/output circuit 120 and the row decoder 130 in response to the command CMD and the control signal CTRL. The control signal CTRL is provided from the memory interface 210 (see FIG. 1) and the memory controller (refer to 712 of FIG. 12). The control logic and high voltage generator 140 provides bias voltages to the word lines during read, write and erase operations.

During a read operation, the control logic and high voltage generator 140 generates the selective read voltage Vrd, which is applied to a selected word line, and the de-selective read voltage Vread that is applied to the de-selected word lines. In general, the de-selective read voltage Vread is a higher voltage than the selective read voltage Vrd.

Figure 3:
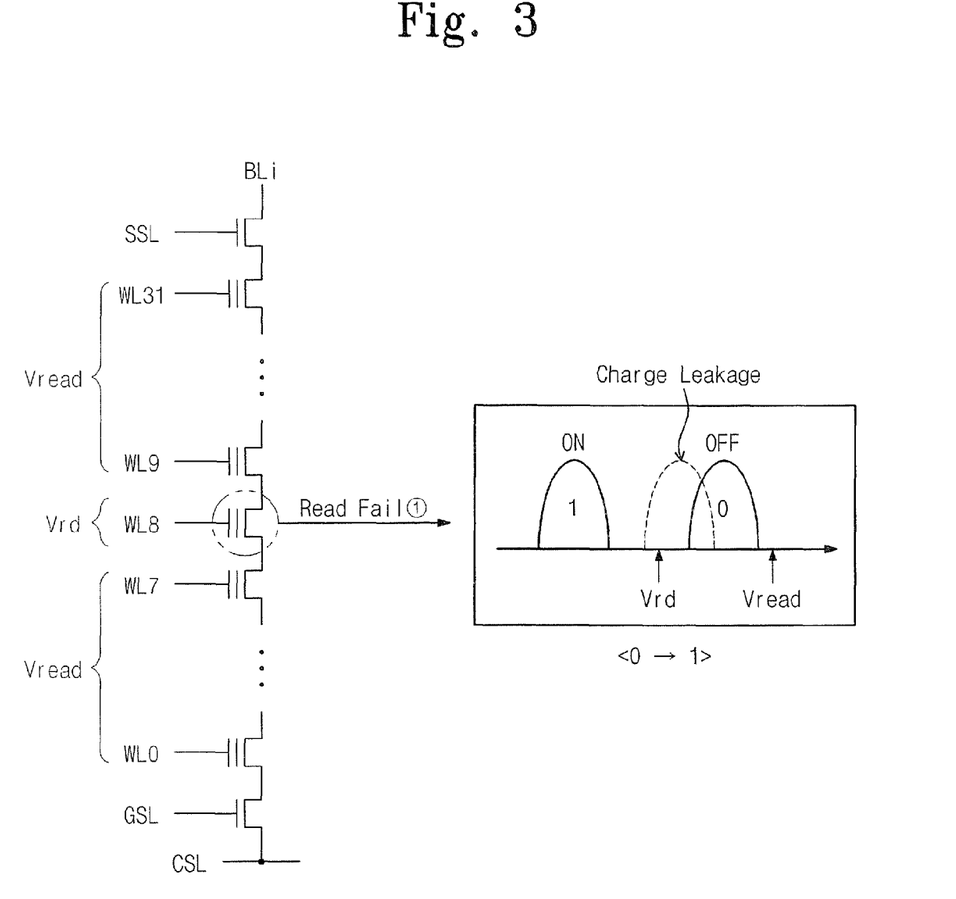
FIG. 3 is a schematic diagram of a cell string of the flash memory shown in FIG. 2 illustrating how a read failure may occur due to charge leakage.
Figure 4:
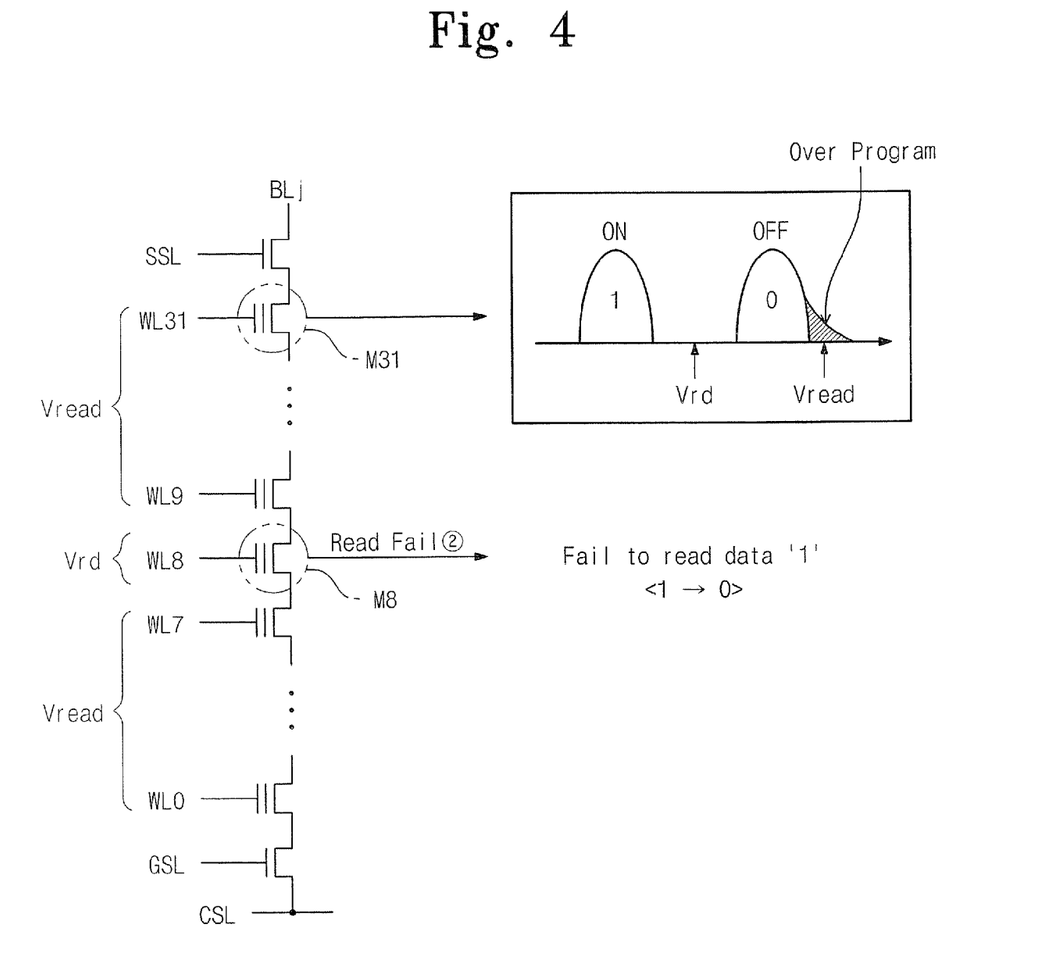
FIG. 4 is a schematic diagram illustrating the cell string of the flash memory shown in FIG. 2 illustrating how a read failure may occur due to over-programming.
Figure 6:
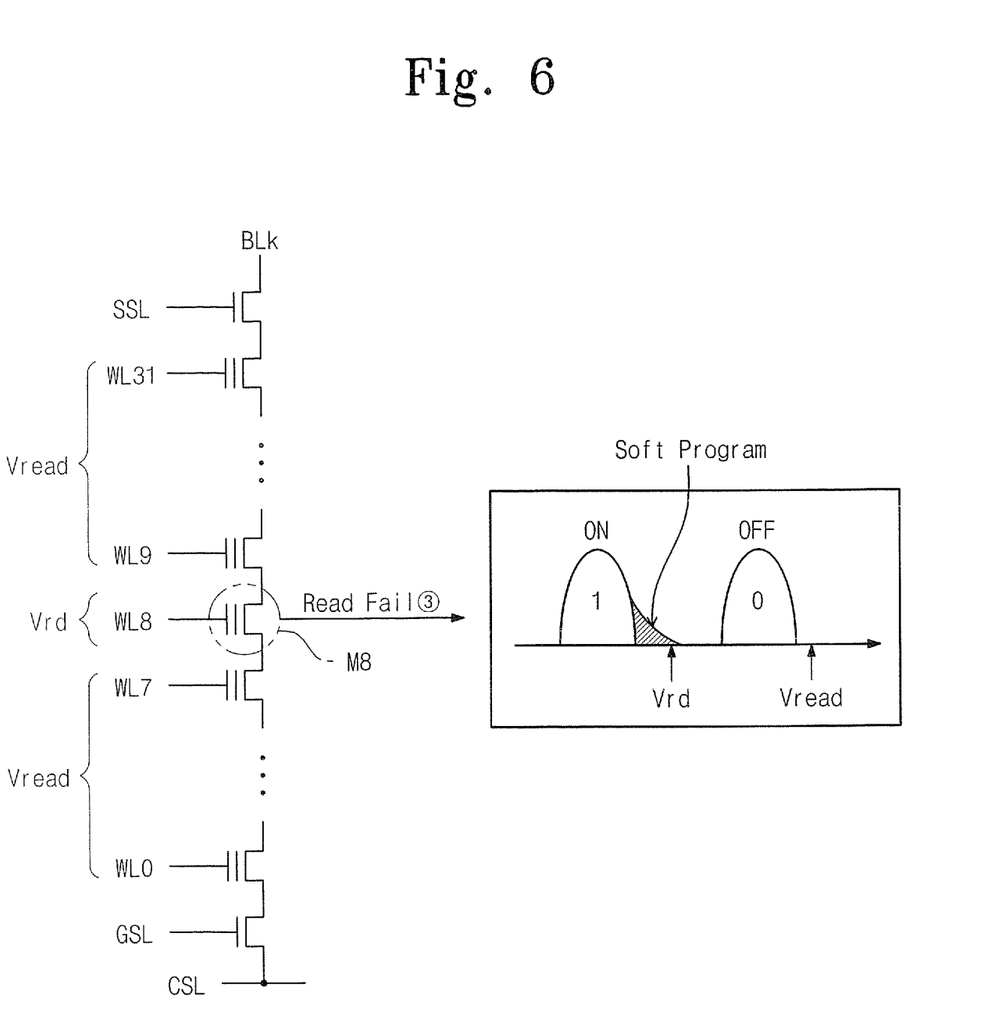
FIG. 6 is a schematic diagram of a cell string of the flash memory shown in FIG. 2 illustrating how a read failure may occur due to soft-programming.

FIGS. 3, 4 and 6 depict three reasons why read failures may occur in the flash memory of FIG. 2. FIG. 3 depicts a read failure due to charge leakage, FIG. 4 depicts a read failure due to over-programming, and FIG. 6 depicts a read failure due to soft-programming.

A read failure which occurs because of charge leakage involves a memory cell that has been programmed with data "0" (i.e., an off-cell) being sensed as storing data "1" (i.e., an on-cell). Other read fails which occur because of over-programming or soft-programming involve a memory cell that has been programmed with data "1" (i.e., an on-cell) being sensed as storing data "0" (i.e., an off-cell).

FIG. 3 is a schematic diagram of a cell string of the flash memory 100 of FIG. 2 illustrating how a read failure due to charge leakage may occur. As shown in FIG. 3, a ground selection transistor, a plurality of memory cells and a string selection transistor are connected in series between the common source line CSL and the bit line BLi. A ground selection line GSL is coupled to the ground selection transistor and the word lines WL0~WL31 are coupled to respective ones of the plurality of memory cells. A string selection line SSL is coupled to the string selection transistor.

During a read operation, a selective read voltage Vrd of, for example, about 0 V is applied to a selected word line (e.g., WL8), while a de-selective read voltage Vread of, for example, about 4.5V is applied to the de-selected word lines WL0~WL7 and WL9~WL31. The de-selective read voltage Vread is sufficient to turn on the memory cells that are coupled to the de-selected word lines WL0~WL7 and WL9~WL31.

Charge leakage may induce a read failure as follows. Repeated programming and erasing of a memory cell can cause oxide films of the memory cell to deteriorate and thereby produce electrons, which may be trapped in a floating gate or oxide film of the memory cell, from which they can move to a channel of the memory cell.

If electrons leak from the floating gate or an oxide film into the channel, the threshold voltage of the memory cell may be reduced. Thus, as shown in FIG. 3, the threshold voltage distribution of off-cells shifts closer to the threshold voltage distribution of on-cells. If a threshold voltage of an off-cell becomes lower than the selective read voltage Vrd, the off-cell is detected as an on-cell during a read operation, and thus a memory cell that was programmed with data "0" will be sensed as storing data "1."

A read failure that is caused by charge leakage can be identified by analyzing an error correction code. Specifically, the memory controller 200 can determine that a read failure is due to charge leakage by means of error check and correction (ECC) analysis. Operations for repairing a read failure that is due to charge leakage are described herein in conjunction with FIG. 9.

FIG. 4 is a schematic diagram of a cell string of the flash memory 100 of FIG. 2 illustrating how a read failure due to over-programming may occur. As shown in FIG. 4, the ground selection transistor is coupled to the ground selection line GSL and the plurality of memory cells are coupled to respective ones of the word lines WL0~WL31. The string selection transistor is coupled to the string selection line SSL. During a read operation, the selective read voltage Vrd is applied to a selected word line (e.g., WL8) while the de-selective read voltage Vread is applied to the de-selected word lines WL0~WL7 and WL9~WL31.

Figure 5:
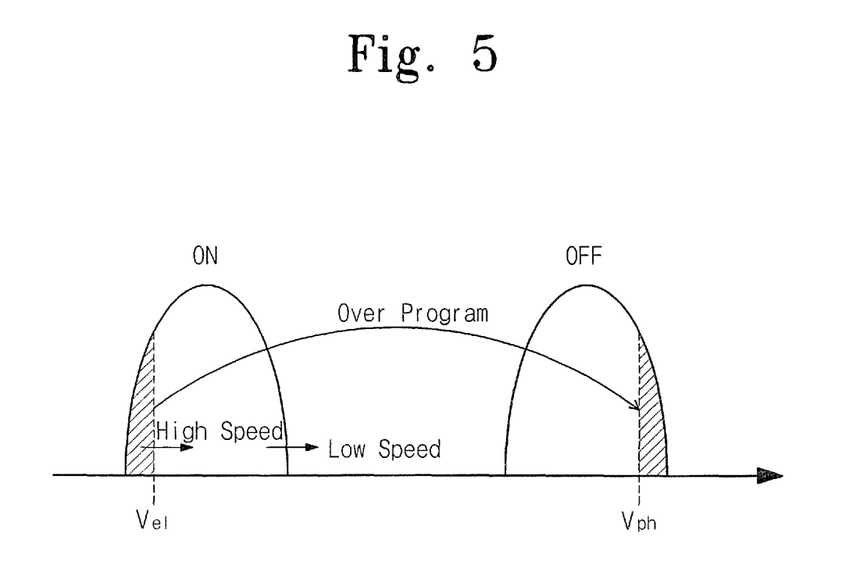
FIG. 5 is a graphic diagram illustrating an effect of over-programming the memory cell shown in FIG. 4.

If a de-selected memory cell (e.g., M31) is over-programmed, a read failure may occur due to the over-programming of memory cell M31 when the selected memory cell M8 is read. An example as to how the de-selected memory cell M31 may be over-programmed is shown in FIG. 5. As shown in FIG. 5, as a memory cell having a threshold voltage lower than a bottom erasing voltage Vel is programmed faster than a memory cell having a threshold voltage not lower than Vel, the memory cell under the bottom erasing voltage Vel may be easily conditioned over a top erasing voltage Vph after programming.

As illustrated in FIG. 4, if the de-selected memory cell M31 is over-programmed by way of for example, the mechanism discussed above with respect to FIG. 5, the channel resistance of the cell string may increase. If the channel resistance increases, a read failure may occur when the selected memory cell M8 is read. In particular, if a threshold voltage of the de-selected memory cell M31 is higher than the de-selective read voltage Vread, the de-selected memory cell M31 is turned off during the read operation. If the de-selected memory cell M31 is turned off, the selected memory cell MS is sensed as an off-cell (i.e., as storing data "0").

If one of the memory cells of the cell string is over-programmed, a read failure may occur when the selected memory cell M8 is read. A read failure due to over-programming causes a memory cell that has been programmed with data "1" to be sensed as storing data "0."

FIG. 6 is a schematic diagram of a cell string of the flash memory 200 of FIG. 2 illustrating how a third read failure due to soft-programming may occur. As shown in FIG. 6, the ground selection transistor is coupled to the ground selection line GSL and the plurality of memory cells are coupled to respective ones of the word lines WL0~WL31. The string selection transistor is coupled to the string selection line SSL. During a read operation, the selective read voltage Vrd is applied to a selected word line (e.g., WL8) and the de-selective read voltage Vread is applied to de-selected word lines WL0~WL7 and WL9~WL31.

Figure 7:
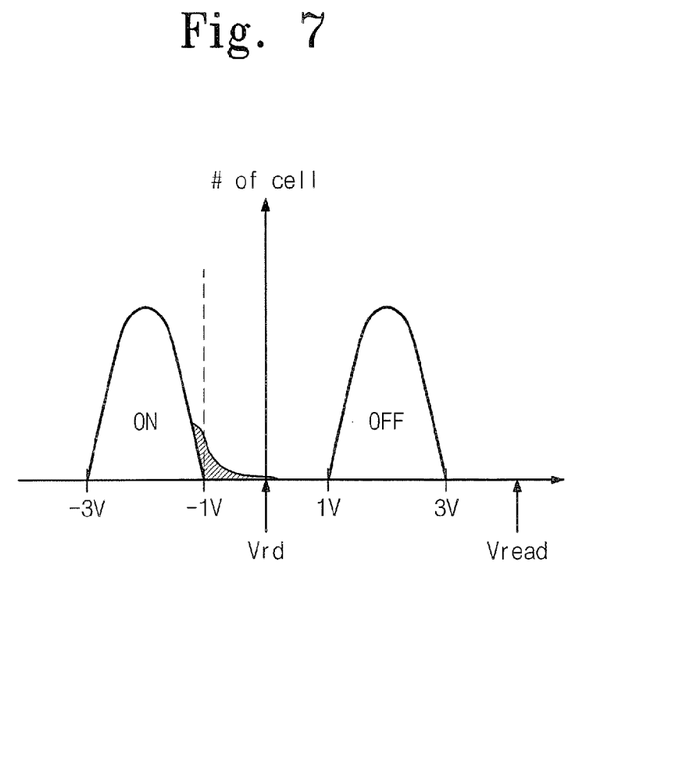
FIG. 7 is a graphic diagram illustrating a soft-programmed effect of the memory cell shown in FIG. 6.
Figure 8:
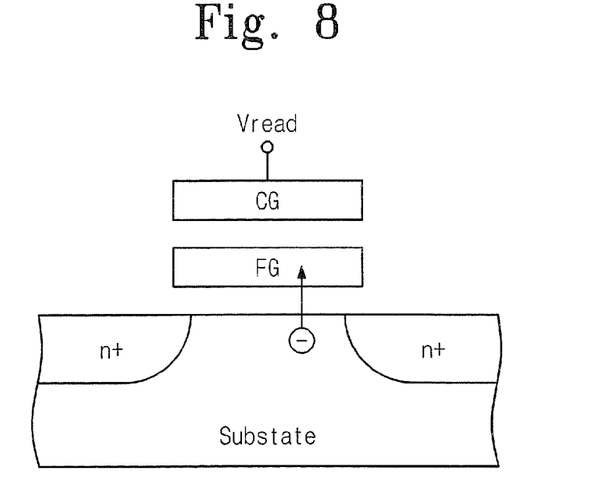
FIG. 8 is a schematic cross-sectional diagram of one of the memory cells of FIG. 6.

If the selected memory cell M8 is soft-programmed, a read failure will occur when the selected memory cell M8 is read. FIGS. 7 and 8 illustrate how the selected memory cell may be soft-programmed.

Referring to FIG. 7, an on-cell has a threshold voltage that is conditioned between, for example, −3 V and −1 V, while an off-cell has a threshold voltage that is conditioned between, for example, +1 V and +3 V. The selective read voltage Vrd that is applied to the selected word line (i.e., WL8) is set at about 0 V. The dc-selective read voltage Vread that is applied to the de-selected word lines WL0~WL7 and WL9~WL31 is set at about 4.5 V.

In the flash memory, the read operation is carried out in the unit of a page. Assuming that all of the pages of the memory block, e.g., 32 pages, are put into the read operation, one of the word lines WL0~WL31 is supplied with the selective read voltage Vrd and the remaining 31 word lines WL0~WL31 are supplied with the de-selective read voltage Vread. When the de-selective read voltage Vread, which is higher than the power source voltage Vcc, is repeatedly applied to the control gates of the memory cells, the memory cells are stressed therefrom.

As illustrated in FIG. 8, when the de-selective read voltage Vread is applied to the control gate CG of the memory cell, electrons flow into the floating gate FG from the channel. When this occurs, a threshold voltage of the on-cell increases. If a threshold voltage of an on-cell is elevated by −1 V, then the threshold voltage of the on-cell is higher than the selective read voltage Vrd. If this occurs, the on-cell will be inadvertently read as an off-cell.

As such, if the threshold voltage of a memory cell increases due to repetitive application of the de-selective read voltage Vread, a read failure may occur due to soft-programming. The cross-hatched portion of the on-cell threshold voltage distribution in FIG. 7 shows that threshold voltage of a memory cell increases as a result of this soft-programming effect. If soft-programming causes a threshold voltage of a memory cell to be raised, the memory cell loses its data storage capability.

A variety of improvements have been made to flash memories that provide accelerated read and write operation rates and increased data storage capacity. One such improvement involves the development of flash memories that include both memory blocks that store multi-bit data (hereinafter referred to as an "MLC block") and memory blocks that store single-bit data (hereinafter referred to as a "SLC block").

Flash memories that include both MLC blocks and SLC blocks may be particularly prone to soft-programming induced read failures. In particular, a memory cell of an SLC block may be prone to soft-programming induced read failures because the de-selective read voltage that is used with the SLC block may be the same voltage that is used as the de-selective read voltage of an MLC block. As discussed above, the soft-programming results in a memory cell (e.g., M8) that was programmed as an on-cell being sensed as an off-cell (or storing data "0"). In other words, the soft-programming induced read failure results in data "1" being read out as data "0."

Figure 9:
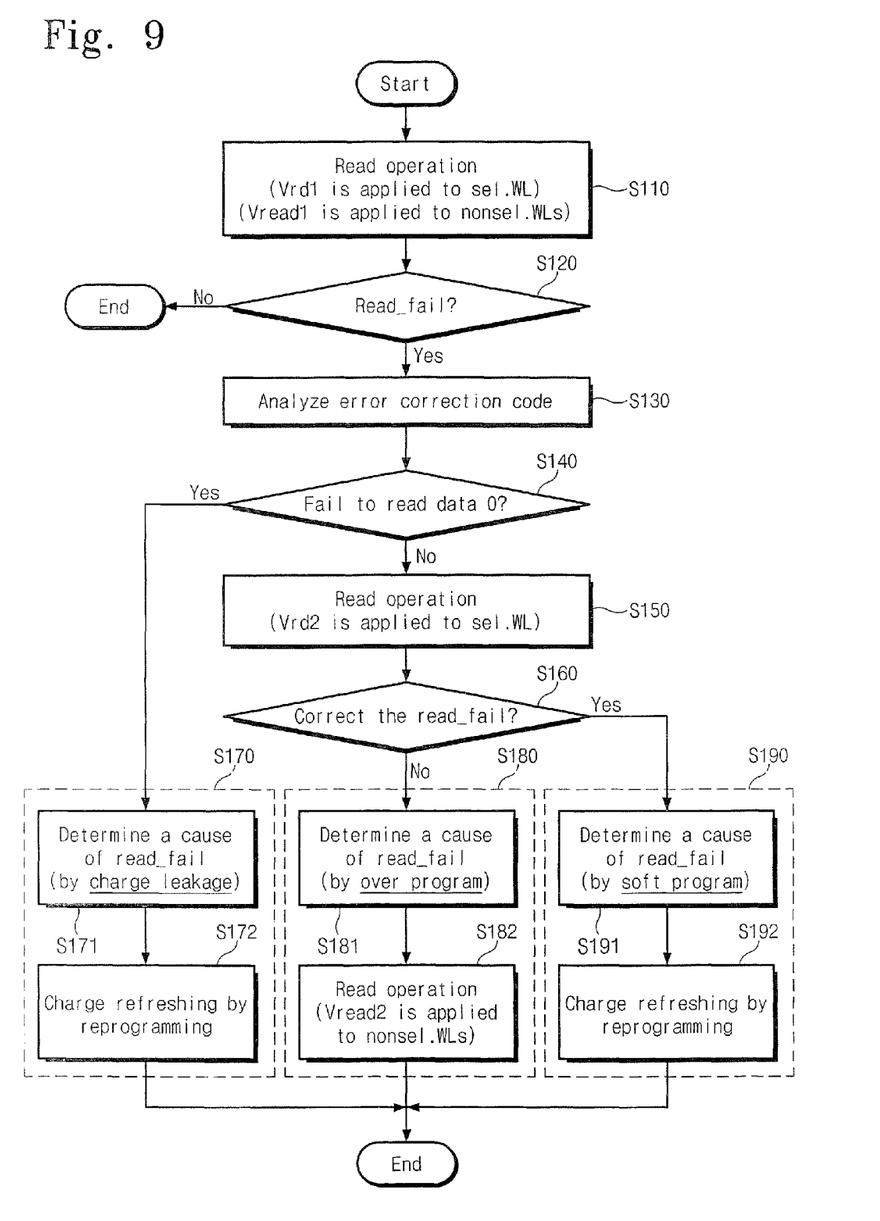
FIG. 9 is a flow chart illustrating operations for analyzing and repairing a read failure according to embodiments of the present invention.

FIG. 9 is a flow chart illustrating operations according to embodiments of the present invention for analyzing and repairing a read failure that occurs, for example, in the semiconductor memory device shown in FIG. 1. Pursuant to the method illustrated in FIG. 9, it is possible to determine the reason for a read failure through ECC analysis and/or change of a selective read voltage, and then to repair the read failure in a manner consistent with the reason for the read failure.

As shown in FIG. 9, operations may begin at block S110 with the performance of a read operation. As discussed above with respect to FIG. 1, the flash memory 100 receives a read command and an address from the memory controller 200 and conducts the read operation on a selected page. During this read operation, a first selective read voltage Vrd1 is applied to a selected word line, while a first de-selective read voltage Vread1 is applied to the de-selected word lines.

Next, at block S120, a determination is made as to whether the read operation passed or failed. If the read operation was successful, operations are terminated. If a read failure occurred, further operations are performed in order to determine the reason for the read failure.

In particular, at block S130, an ECC code is analyzed. As shown in FIG. 1, the memory controller 200 includes an ECC unit 230 that is used to detect and correct bit errors. The ECC unit 230 is able to identify the locations of bit errors that occur in reading data out of the flash memory 100. If the number of bit errors is within a permissible range, the ECC unit 230 corrects the bit errors.

Next, at block S140, a determination is made as to whether there was a read failure in which a memory cell containing data "0" was inadvertently sensed as containing data "1." As discussed above, when a memory cell that was programmed with data "0" is erroneously read as data "1", this generally occurs as a result of charge leakage.

When a read failure is determined to have been induced by charge leakage, operations proceed to block S170. If the read failure instead is found to be the case where a memory cell containing data "1" was inadvertently sensed as containing data "0," then operations instead proceed to block S150. As discussed above, when a memory cell that was programmed with data "1" is erroneously read as data "0", this generally occurs as a result of over-programming or soft-programming.

Figure 10:
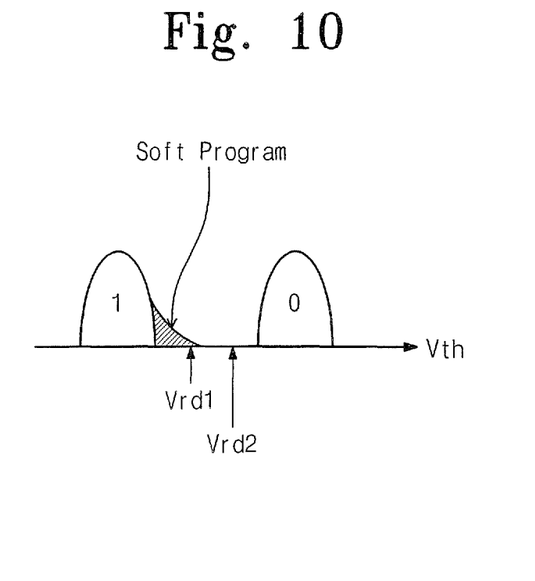
FIG. 10 is a graphic diagram illustrating how a read failure may be is caused by soft-programming.

At block S150, another read operation is performed. The read operation at block S150 is performed to determine whether the read failure was caused by over-programming or by soft-programming. During the read operation at block S150, a second selective read voltage Vrd2 is applied to the selected word line while the first de-selective read voltage Vread1 is applied to the de-selected word lines. As illustrated in FIG. 10, the second selective read voltage Vrd2 is higher than the first selective read voltage Vrd1.

At block S160, a determination is made as to whether the read failure has been repaired. If the read failure was due to soft-programming, the increase in the selective read voltage applied at block S150 can repair the read failure. In particular, as shown in FIG. 10, if the second selective read voltage Vrd2 is set higher than the threshold voltage of the soft-programmed memory cell, the read failure may be cured. However, the resetting of the selective read voltage will not operate to repair a read failure that results from over-programming.

Thus, according to embodiments of the present invention, read failures that are caused by charge leakage can be identified by means of ECC analysis, and read Failures that are due to soft-programming or over-programming can be discriminated by increasing the selective read voltage and re-performing the read operation. Thus, according to embodiments of the present invention, mechanisms are provided for determining the reason for a read failure, which allows for the repair of the read failure in a manner consistent with the underlying cause of the read failure.

Turning again to FIG. 9, at block S170, a determination is made that the read failure was caused by charge leakage (block S171), and this read failure is then repaired at block S172 through charge refresh by reprogramming.

If operations instead proceed to block S180, a determination is made that the read failure was caused by over-programming (block S181), and this read failure is then repaired at block S182 by applying the second de-selective read voltage Vread2 to the de-selected word lines.

Figure 11:
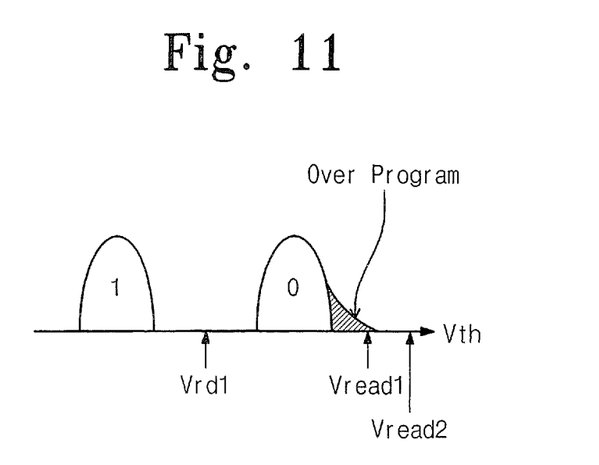
FIG. 11 is a graphic diagram illustrating how a read failure may be caused by over-programming.

As shown in FIG. 11, the first selective read voltage Vrd1 is applied to a selected word line while the second de-selective read voltage Vread2 is applied to the de-selected word lines. The second de-selective read voltage Vread2 is higher than the first de-selective read voltage Vread1. By applying the second de-selective read voltage Vread2 to the de-selected word lines, the read failure due to over-programming is cured.

If operations instead proceed to block S190, a determination is made that the read failure was caused by soft-programming (block S191), and this read failure is then repaired at block S192 through charge refresh by reprogramming.

Figure 12:
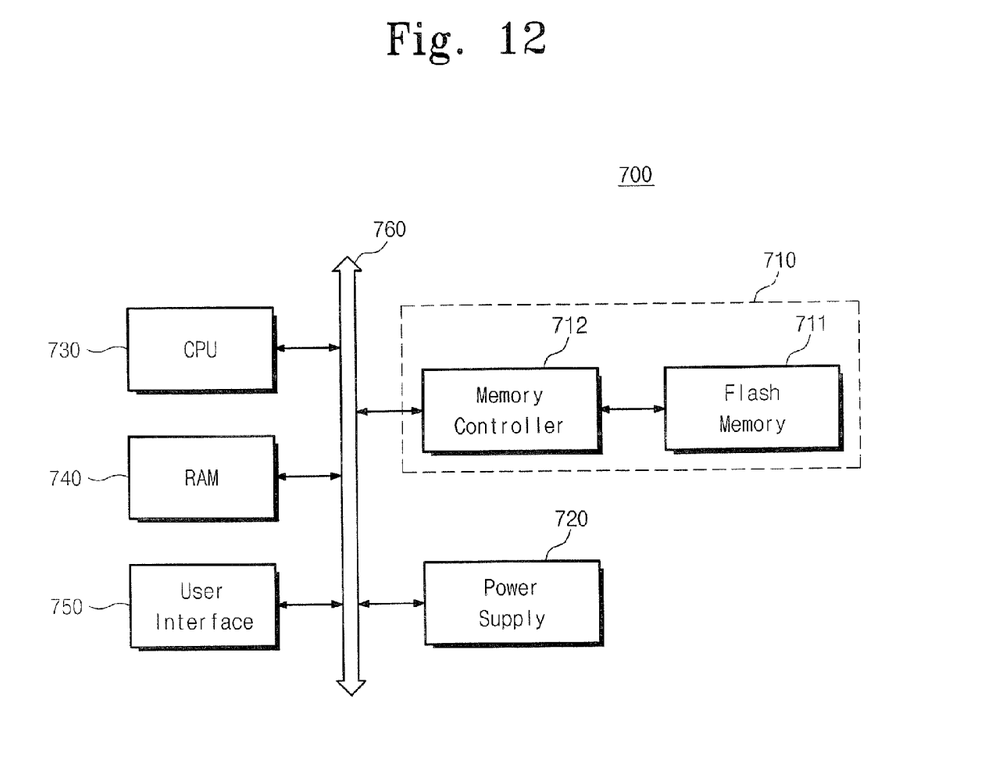
FIG. 12 is a block diagram of a memory system that includes a semiconductor memory device according to embodiments of the present invention.

FIG. 12 is a block diagram of a memory system that includes a semiconductor memory device 700 according to embodiments of the present invention. Referring to FIG. 12, the memory system 700 is comprised of a semiconductor memory device 710, a power supply 720, a CPU 730, a RAM 740, a user interface 750, and a system bus 760.

The semiconductor memory device 710 includes a flash memory 711 and a memory controller 712. The semiconductor memory device 710 may be designed with a unit product of flash memory, or with a single integrated circuit such as a one-NAND® flash memory. The flash memory 712 receives a read command and an address from the memory controller 712, analyzes an ECC code, and controls a level of the selective read voltage Vrd or of the de-selective read voltage Vread.

The semiconductor memory device 710 is electrically connected to the power supply 720, the CPU 730, the RAM 740, and the user interface 750 by a system bus 760. The flash memory 711 stores data, which is provided through the user interface 750 or processed through the CPU 730, by the memory controller 712.

If the semiconductor memory device 710 is employed in a semiconductor solid state disk (SSD), the memory system 700 would be greatly improved in booting speed. Although not shown, the memory system 700 shown in FIG. 12 may be used in an application chipset or a camera image processor.

The semiconductor memory device 710 can be mounted on the system 700 by way of various types of packages. For instance, the flash memory 711 and/or the controller 712 may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory device comprising:
a nonvolatile memory that includes a plurality of memory cells;
an error correction unit; and
a controller that is configured to:
determine, using an output of the error correction unit, that a read failure occurred during a read operation of a first of the plurality of memory cells;
determine, by changing a selective read voltage, whether the read failure resulted because the first of the plurality of memory cells was programmed with data having a first value but was sensed as storing data having a second value or because the first of the plurality of memory cells was programmed with data having the second value but was sensed as storing data having the first value; and
repair the read failure if it is due to charge leakage or to soft-programming by re-programming, and to repair the read failure if it is due to over-programming by increasing a non-selective read voltage.

2. The semiconductor memory device as set forth in claim 1, wherein the controller is further configured to increase a selective read voltage and perform a second read operation on the first of the plurality of memory cells if it is determined that the first of the plurality of memory cells was programmed with data having the first value but was sensed as storing data having the second value.

3. The semiconductor memory device as set forth in claim 1, wherein the controller is further configured to determine if the read failure is due to soft-programming by increasing a selective read voltage and performing a second read operation on the first of the plurality of memory cells.

4. The semiconductor memory device as set forth in claim 3, wherein the controller is further configured to identify the read failure as being caused by soft-programming when a second read failure does not occur during the second read operation, and is also configured to identify the read failure as being caused by over-programming when the second read failure occurs during the second read operation.

5. The semiconductor memory device as set forth in claim 1, wherein data having the first value comprises data having a value of "1" and data having the second value comprises data having a value of "0."

6. The semiconductor memory device as set forth in claim 1, wherein the controller is further configured to repair the first of the plurality of memory cells by a charge refresh operation when the output of the error correction unit indicates that the first of the plurality of memory cells was programmed with data having the second value but was sensed as storing data having the first value.

7. A method for analyzing a read failure that occurred during a first data read operation of a first memory cell of a nonvolatile memory of a semiconductor memory device, the method comprising:
analyzing error correction code data that is associated with data that was read from the nonvolatile memory during the first data read operation to determine a cause of the read failure from one of a plurality of possible causes for the read failure, wherein the cause of the read failure is determined based at least in part on a value that was programmed into the first memory cell that was incorrectly sensed during the first data read operation; and
repairing the read failure by re-programming if the cause of the read failure is determined to be either charge leakage or soft-programming, and repairing the read failure by increasing a non-selective read voltage if the cause of the read failure is determined to be over-programming.

8. The method as set forth in claim 7, the method further comprising:
increasing a selective read voltage that was used in the first data read operation;
performing a second read operation using the increased selective read voltage to determine whether the read failure resulted because of soft-programming.

9. The method as set forth in claim 8, further comprising identifying the read failure as being caused by soft-programming if a second read failure does not occur during the second read operation.

10. The method as set forth in claim 8, further comprising identifying the read failure as being caused by over-programming if a second read failure occurs during the second read operation.

* * * * *